US011516948B2

(12) United States Patent
Navarro et al.

(10) Patent No.: US 11,516,948 B2
(45) Date of Patent: Nov. 29, 2022

(54) IMMERSION COOLING SYSTEMS AND METHODS FOR ELECTRICAL POWER COMPONENTS

(71) Applicant: Eaton Intelligent Power Limited, Dublin (IE)

(72) Inventors: George Arthur Navarro, Raleigh, NC (US); Miguel E. Chavez, Raleigh, NC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/834,120

(22) Filed: Mar. 30, 2020

(65) Prior Publication Data

US 2020/0323109 A1    Oct. 8, 2020

Related U.S. Application Data

(60) Provisional application No. 62/828,120, filed on Apr. 2, 2019.

(51) Int. Cl.
*H05K 7/20* (2006.01)

(52) U.S. Cl.
CPC ......... *H05K 7/20927* (2013.01); *H05K 7/209* (2013.01); *H05K 7/20172* (2013.01); *H05K 7/20236* (2013.01); *H05K 7/20272* (2013.01); *H05K 7/20909* (2013.01)

(58) Field of Classification Search
None
See application file for complete search history.

(56) References Cited

U.S. PATENT DOCUMENTS

| | | | | |
|---|---|---|---|---|
| 4,619,316 A * | 10/1986 | Nakayama | ............ | F28F 13/187 165/104.33 |
| 5,195,577 A * | 3/1993 | Kameda | ............... | F28D 15/0266 165/104.13 |
| 7,859,819 B2 * | 12/2010 | Fahrenbach | ............. | H01G 2/08 361/274.2 |
| 8,826,675 B2 * | 9/2014 | Rodriguez | ............ | F25B 31/006 62/62 |
| 8,902,034 B2 * | 12/2014 | MacLennan | ............ | H01F 27/18 336/60 |
| 10,028,409 B1 * | 7/2018 | Metzler | ............... | H05K 7/20936 |
| 10,212,849 B2 * | 2/2019 | Matsumoto | ........ | H05K 7/20236 |
| 11,064,626 B1 * | 7/2021 | Salmon | ................ | H05K 3/3436 |
| 11,102,912 B2 * | 8/2021 | Enright | ............. | G05B 19/4189 |
| 2011/0049976 A1 * | 3/2011 | Suzuki | ............... | H05K 7/20936 307/9.1 |
| 2014/0218859 A1 * | 8/2014 | Shelnutt | .................. | G06F 1/206 361/679.46 |
| 2016/0285354 A1 * | 9/2016 | Handy | ..................... | H01F 27/18 |
| 2017/0265336 A1 * | 9/2017 | Ichinose | .................... | G06F 1/20 |
| 2017/0290198 A1 * | 10/2017 | Shepard | ............. | H05K 7/20236 |
| 2018/0042138 A1 * | 2/2018 | Campbell | .............. | H05K 7/203 |
| 2019/0131966 A1 * | 5/2019 | Schmitz | ................. | H01H 33/04 |

* cited by examiner

*Primary Examiner* — Courtney L Smith
(74) *Attorney, Agent, or Firm* — Stanek Lemon Crouse & Meeks, P.A.

(57) ABSTRACT

A system includes a vessel, a cooling fluid in the vessel, and at least one power magnetics assembly in the vessel and immersed in the cooling fluid. The system further includes at least one heat sink having a surface in contact with the cooling fluid in the vessel and at least one power semiconductor device mounted on the at least one heat sink. The cooling fluid may be electrically insulating and the vessel may be sealed.

16 Claims, 3 Drawing Sheets

IMMERSION COOLING SYSTEMS AND METHODS FOR ELECTRICAL POWER COMPONENTS

CROSS-REFERENCE TO RELATED APPLICATION

The present application claims the benefit of U.S. Provisional Patent Application Ser. No. 62/828,120 entitled "IMMERSION COOLING SYSTEMS AND METHODS FOR ELECTRICAL POWER COMPONENTS," filed Apr. 2, 2019, and incorporated herein by reference in its entirety.

BACKGROUND

The inventive subject matter relates to uninterruptible power systems (UPSs) similar power conversion apparatus and, more particularly, to cooling for such systems.

Datacenter customers typically want an uninterruptible power supply (UPS) solution that offers power quality and critical power backup required of their mission critical operations. Thermal management of power electronics assemblies, such as uninterruptible power supplies (UPSs) used in data center applications, has traditionally relied on fan-based systems which use forced air as a cooling medium for large and/or heavy heat sinks and heavy copper trace power printed circuit board assemblies (PCBAs).

Immersion cooling is gaining adoption in datacenter applications. For example, immersion cooling has been proposed for server cards and other computing subassemblies, wherein a value proposition of increased IT density and elimination of datacenter cooling infrastructure can be quite favorable.

SUMMARY

Some embodiments of the inventive subject matter provide a system including a vessel, a cooling fluid in the vessel, and at least one power magnetics assembly in the vessel and immersed in the cooling fluid. The system further includes at least one heat sink having a surface in contact with the cooling fluid in the vessel and at least one power semiconductor device mounted on the at least one heat sink. The cooling fluid may be electrically insulating and the vessel may be sealed.

In some embodiments, the at least one power semiconductor device may be immersed in the cooling fluid. In some embodiments, the at least one heat sink has a surface in contact with air external to the vessel. The at least one power semiconductor device may be positioned on a surface of the at least one heat sink external to the vessel. The system may further include an air moving device, such as a fan, configured to force an airflow across the at least one heat sink.

In some embodiments, the vessel may include a sump and coolant passage in fluid communication with the sump. The at least one power magnetic assembly may be positioned in the sump. The at least one heat sink may include at least one surface in the coolant passage. The at least one heat sink may be positioned above the sump and the cooling fluid may circulate by convection. The coolant passage may include first and second coolant passages in fluid communication with the sump, and the cooling fluid may circulate from the sump, through the first and second coolant passages and back to the sump. The at least one heat sink may include at least one heat sink positioned between the first and second coolant passages.

Further embodiments provide a system including a vessel having a sump and first and second coolant passages in fluid communication with the sump and configured to support circulation of a cooling fluid from the sump, through the first and second coolant passages and back to the sump. The system also includes at least one power magnetics assembly in the sump and at least one heat sink having a surface in at least one of the first and second coolant passages. At least one power semiconductor device may be mounted on the at least one heat sink.

In some embodiments, the at least one power semiconductor device is immersed in the cooling fluid. In further embodiments, the at least one heat sink may have a surface in contact with air external to the vessel. The at least one power semiconductor device may be positioned on a surface of the at least one heat sink external to the vessel. The system may further include an air moving device configured to force an airflow across the at least one heat sink.

DETAILED DESCRIPTION

Figure 1:
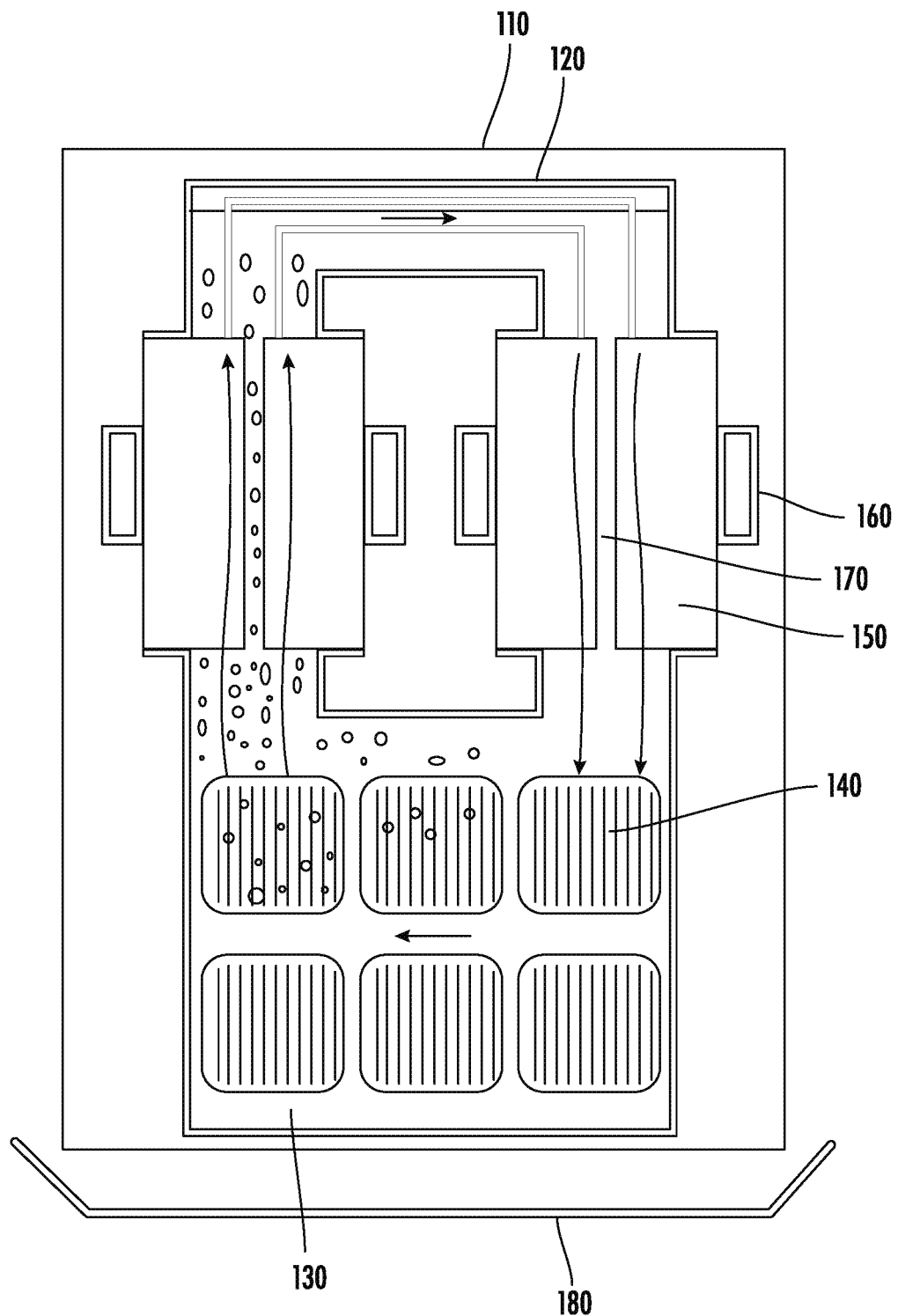
FIG. 1 illustrates a liquid-cooled power processing system according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

According to some embodiments of the inventive subject matter, immersion cooling can increase power processing density, increase reliability in such power electronics assemblies by eliminating moving parts, and reduce costs. Immersion cooling of power electronics assemblies in high-dielectric strength fluid can enable assemblies to be deployed in harsh environments (outdoor applications, industrial environments, etc.) without requiring reinforcing insulation or isolation techniques, such as increased distances and footprint. In particular, immersion cooling can be applied to the electrical power infrastructure in the datacenter and adjacent areas, including uninterruptible power supplies (UPS), grid-tie energy storage inverters, and power distribution equipment.

According to some embodiments, power processing equipment, such as power semiconductors, transformers and power inductors, may be submerged in a high-dielectric strength non-conductive liquid. FIG. 1 illustrates a system in which magnetics assemblies 140, such as inductors, transformers and the like, are submerged in a high dielectric strength cooling fluid, such as the commercially available 3M™ Novec™, in a sump 130 of a sealed vessel 120 that protects against contamination and other deleterious effects in harsh environments. Power semiconductor devices 160, such as insulated gate bipolar transistors (IGBTs), thyristors and the like, are mounted on heat sinks 150 that are in contact with the cooling fluid in one or more coolant passages 170 of the vessel 120 that are in fluid communication with the sump 130. The heat sinks 150 may include, for example, fins that are designed to increase heat transfer between the fins and the cooling fluid. Heat generated by the magnetic assemblies 140 may volatize the cooling fluid, causing turbulence/scrubbing of the heat sinks. The thermal mass of the power semiconductor devices 160, heat sinks 170 and attached conductors (e.g., bus bars typically used in UPS s and similar power processing devices) may be used to condense the cooling fluid and encourage the convective flow of the fluid, without need for a fan or similar air moving device. A spill container 180 may be provided for containing spills and/or for holding and recovering cooling fluid.

Figure 2:
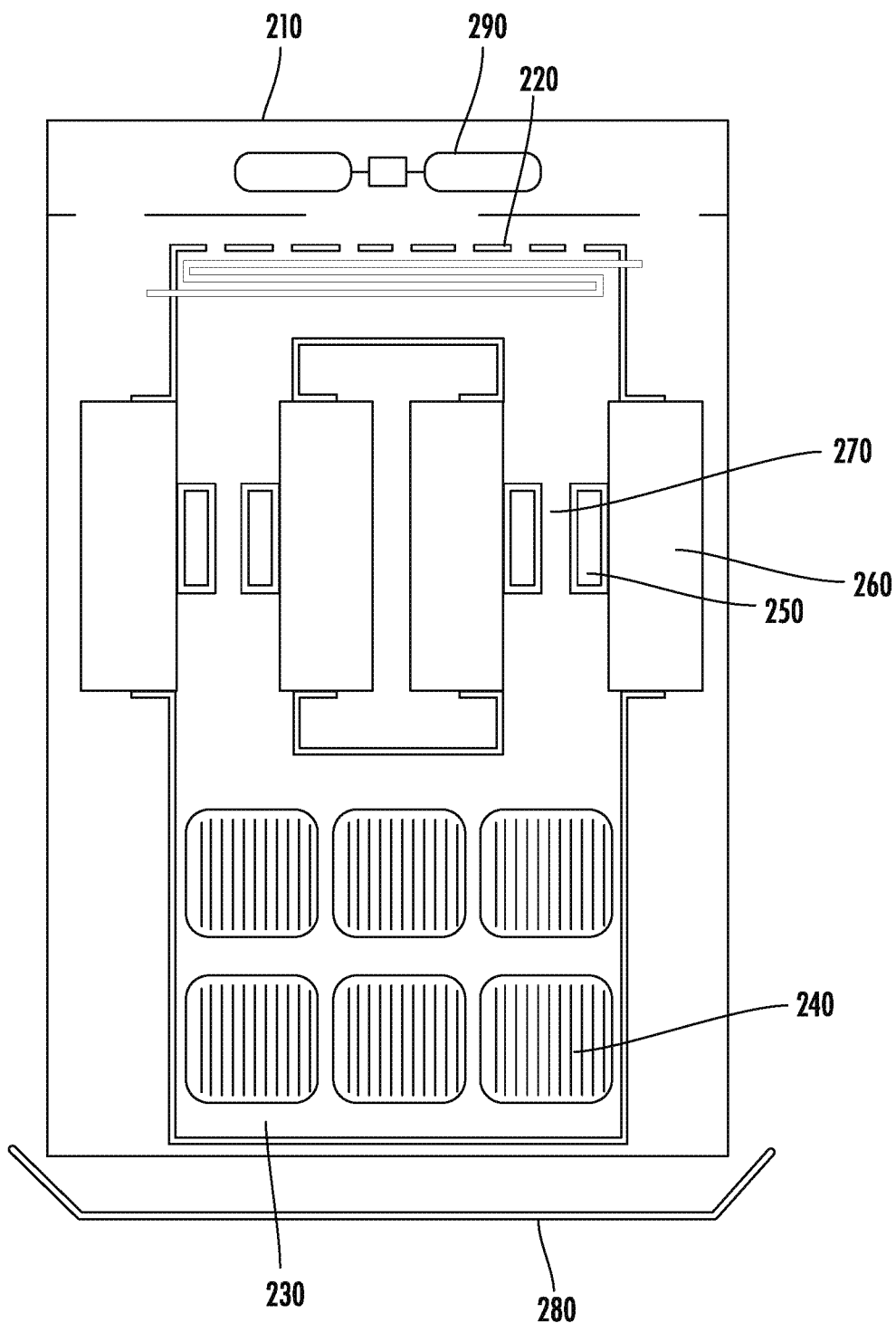
FIG. 2 illustrates a liquid-cooled power processing system according to some embodiments.

FIG. 2 illustrates a system according to further embodiments. In this system, power semiconductor devices 250 (e.g., IGBT modules or the like) are immersed along with magnetics assemblies 240 in a sump 230 of a cooling fluid containing vessel 220 that is housed within an enclosure 210. Heat sinks 260 on which the power semiconductor devices 250 are mounted are in thermal communication with the cooling fluid and also exposed to air, which may by circulated by convection and/or by a fan 290 or other air moving device. The heat sinks 260 may serve multiple functions, including transfer of heat from the cooling fluid and the semiconductor devices 250 to the outside air, as well as portals for fluid monitoring and access. As with the embodiments of FIG. 1, the heat sinks 260 can serve as a condenser for cooling fluid volatilized by the electrical components immersed in the cooling fluid. The fan 290 (or other air mover) may be operated on a demand basis, e.g., when heat sink temperatures meet certain criteria. A spill container 280 may be provided for containing spills and/or for holding and recovering cooling fluid.

Figure 3:
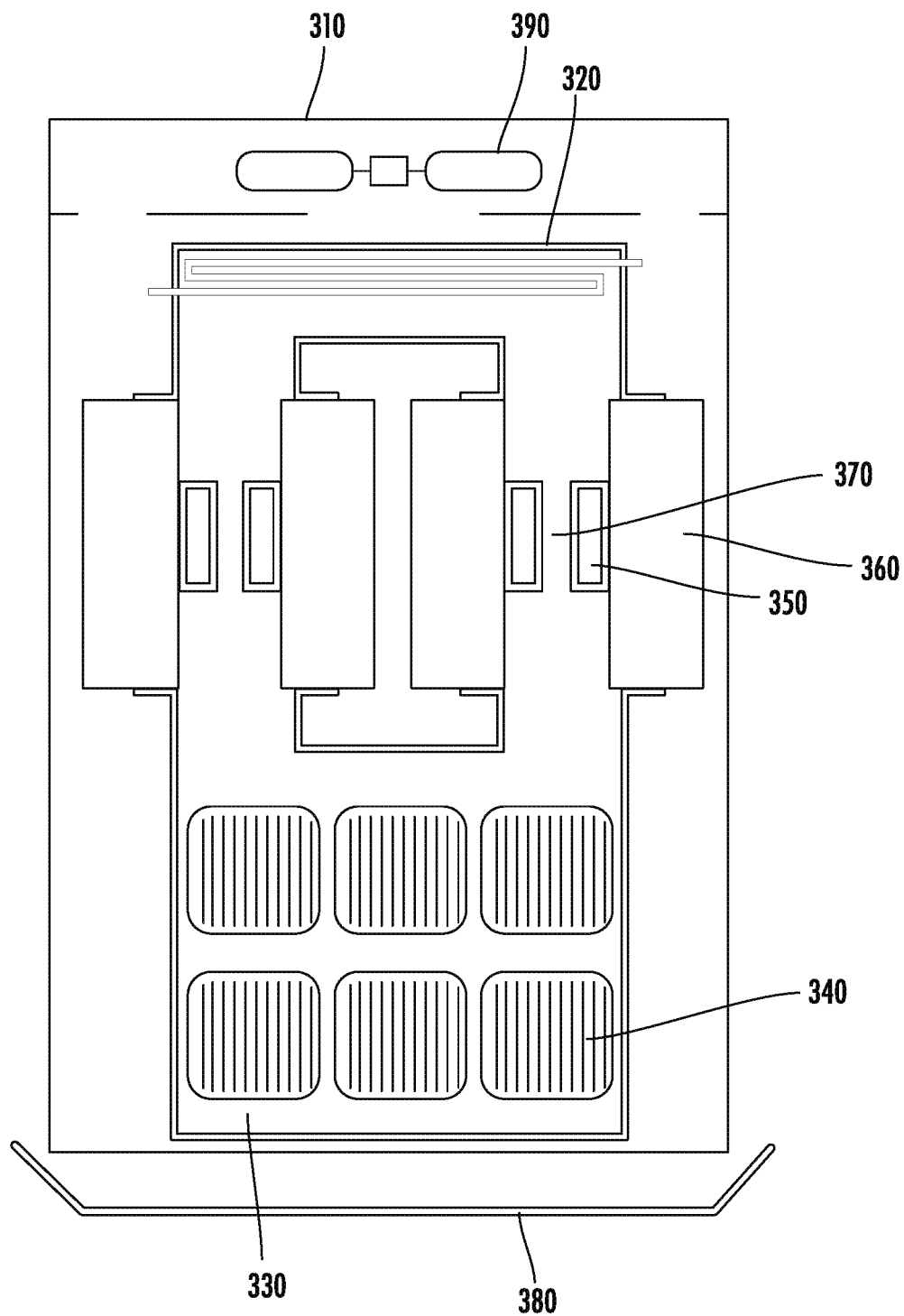
FIG. 3 illustrates a liquid-cooled power processing system according to some embodiments.

FIG. 3 illustrates a similar system according to still further embodiments, in which an enclosure 310 houses a vessel 320 containing the cooling fluid is sealed to prevent environmental contamination. Similar to the system in FIG. 3, the system in FIG. 3 includes semiconductor devices 350 mounted on heat sinks 360 in a coolant passage 370. Magnetic assemblies 340 are immersed in cooling fluid in a sump 330. A fan 390 or other air-moving device may be provided. A spill container 380 may be provided for containing spills and/or for holding and recovering cooling fluid.

It will be understood that the cooling arrangements described above may be used for other types of power distribution system components, such as batteries or other energy storage components.

In this specification, there have been disclosed embodiments of the inventive subject matter and, although specific terms are employed, they are used in a generic and descriptive sense only and not for purposes of limitation. The following claims are provided to ensure that the present application meets all statutory requirements as a priority application in all jurisdictions and shall not be construed as limiting the scope of the inventive subject matter.

That which is claimed is:

1. A system comprising:
a vessel having a cooling fluid therein and comprising a sump and a coolant passage in fluid communication with the sump and configured to pass a portion of the cooling fluid evaporated from a liquid portion of the cooling fluid disposed in the sump;
at least one power magnetics assembly in the sump and immersed in the liquid portion of the cooling fluid;
at least one heat sink positioned in the coolant passage and having a first surface configured to be exposed to the evaporated portion of the cooling fluid and serving as a condenser for the evaporated portion of the cooling fluid as it passes through the coolant passage and back to the sump via another portion of the vessel; and
at least one power semiconductor device mounted on the at least one heat sink.

2. The system of claim 1, wherein the at least one heat sink has a second surface in contact with air external to the vessel.

3. A system comprising:
a vessel;
a cooling fluid in the vessel;
at least one power magnetics assembly in the vessel and immersed in the cooling fluid;
at least one heat sink having a first surface in contact with the cooling fluid in the vessel; and
at least one power semiconductor device positioned on a second surface of the at least one heat sink external to the vessel.

4. The system of claim 3, further comprising an air moving device configured to force an airflow across the at least one heat sink.

5. The system of claim 4, wherein the air moving device comprises a fan.

6. The system of claim 1, wherein the at least one heat sink is positioned above the sump and wherein the cooling fluid circulates by convection.

7. The system of claim 6, wherein the coolant passage comprises first and second coolant passages in fluid communication with the sump, and wherein the cooling fluid circulates from the sump, through the first and second coolant passages and back to the sump.

8. The system of claim 1, wherein the cooling fluid is electrically insulating.

9. The system of claim 1, wherein the vessel is sealed.

10. A system comprising:
a vessel having a sump and first and second coolant passages in fluid communication with the sump and configured to support circulation of a cooling fluid evaporated from the sump through the first and second coolant passages and back to the sump via a portion of the vessel;

at least one power magnetics assembly in the sump;

at least one heat sink having a first surface configured to be exposed to the evaporated cooling fluid in at least one of the first and second coolant passages serving as a condenser for the evaporated cooling fluid; and at least one power semiconductor device mounted on the at least one heat sink.

11. The system of claim 10, wherein the at least one power semiconductor device is positioned in at least one of the first and second coolant passages.

12. The system of claim 10, wherein the at least one heat sink has a second surface in contact with air external to the vessel.

13. The system of claim 12, wherein the at least one power semiconductor device is positioned on the second surface of the at least one heat sink external to the vessel.

14. The system of claim 12, further comprising an air moving device configured to force an airflow across the at least one heat sink.

15. The system of claim 10, wherein the cooling fluid is electrically insulating.

16. The system of claim 10, wherein the vessel is sealed.

* * * * *